(12) United States Patent
Hsieh

(10) Patent No.: US 9,344,093 B2
(45) Date of Patent: May 17, 2016

(54) COUNTER

(71) Applicant: Nuvoton Technology Corporation, Hsinchu (TW)

(72) Inventor: Tsung-Hsien Hsieh, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 140 days.

(21) Appl. No.: 14/474,314

(22) Filed: Sep. 2, 2014

(65) Prior Publication Data

US 2015/0358023 A1    Dec. 10, 2015

(30) Foreign Application Priority Data

Jun. 4, 2014  (TW) .............................. 103119387 A

(51) Int. Cl.
  *H03K 21/00*  (2006.01)
  *H03K 21/38*  (2006.01)
  *H03K 21/40*  (2006.01)
  *H03K 23/66*  (2006.01)

(52) U.S. Cl.
  CPC ................ *H03K 21/38* (2013.01); *H03K 21/40* (2013.01); *H03K 21/00* (2013.01); *H03K 23/665* (2013.01)

(58) Field of Classification Search
  None
  See application file for complete search history.

(56) References Cited

U.S. PATENT DOCUMENTS

| 4,443,887 | A | * | 4/1984 | Shiramizu | H03K 21/12 377/110 |
| 4,726,045 | A | * | 2/1988 | Caspell | H03K 23/665 327/276 |
| 4,741,004 | A | * | 4/1988 | Kane | H03K 23/665 377/110 |
| 5,373,542 | A | * | 12/1994 | Sunouchi | H03K 23/667 377/44 |
| 5,398,270 | A | * | 3/1995 | Cho | G06F 7/02 327/23 |
| 5,526,391 | A | * | 6/1996 | Shankar | H03K 23/588 377/118 |
| 6,396,894 | B2 | * | 5/2002 | Cao | G11C 19/287 365/221 |
| 6,795,520 | B2 | | 9/2004 | Van Der Valk | |
| 8,644,447 | B2 | * | 2/2014 | Prakash | H03K 21/12 377/107 |
| 2009/0304140 | A1 | * | 12/2009 | Hsieh | H03K 23/58 377/107 |

FOREIGN PATENT DOCUMENTS

TW    I222274    10/2004

\* cited by examiner

*Primary Examiner* — Tuan T Lam
(74) *Attorney, Agent, or Firm* — Jianq Chyun IP Office

(57) ABSTRACT

A counter including a state determination unit and a counter reset unit is provided. The state determination unit is for receiving a current count value to calculate a next count value. The counter reset unit compares a reset counter value and a delay cycle value to determine using a first comparator or a second comparator, and compares the reset counter value and the current count value to output a counter reset signal to the state determination unit to reset the current count value, wherein a bit number of the first comparator is smaller than a bit number of the second comparator.

14 Claims, 5 Drawing Sheets

COUNTER

CROSS-REFERENCE TO RELATED APPLICATION

This application claims the priority benefit of Taiwan application serial no. 103119387, filed on Jun. 4, 2014. The entirety of the above-mentioned patent application is hereby incorporated by reference herein and made a part of this specification.

BACKGROUND OF THE INVENTION

1. Field of the Invention

The embodiments of the invention relate to a counter, and particularly relate to a programmable high speed counter.

2. Description of Related Art

Counters are an important kind of elements in the operation of circuits that may serve as frequency dividers, shifters, or serve for logic operations. In addition, as the science and technology advance, the operating speed of electronic devices is constantly increased, making it necessary to correspondingly increase the speed of the counters. To prevent the function of the electronic devices from being influenced, it has become an important issue to increase the speed of the counters when designing the counters.

SUMMARY OF THE INVENTION

The embodiments of the invention provide a counter capable of reducing an overall gate delay of the counter.

An embodiment of the invention provides a counter configured to output a count value having N bits, N being a positive integer. The counter includes a state determination unit, a value analyzing unit, and a count comparing unit. The state determination unit receives a current count value to calculate a next count value of the counter. In addition, the count value has a high bit count part and a low bit count part. The value analyzing unit receives and outputs a reset counter value, and compares the reset counter value and a delay cycle value to output a value comparing signal. The count comparing unit receives a clock signal, determines to use a first comparator or a second comparator based on the value comparing signal, and outputs a reset counter signal to the state determination unit to reset the count value based on a comparison result and the clock signal. In addition, a bit number of the first comparator is smaller than a bit number of the second comparator.

An embodiment of the invention provides a counter configured to output a count value having N bits, N being a positive integer. The counter includes a state determination unit and a reset counter unit. The state determination unit receives a current count value to calculate a next count value of the counter. In addition, the count value has a high bit count part and a low bit count part. The state determination unit includes a count enabling unit and a value counting unit. The count enabling unit receives the current count value to output a plurality of count enabling signals respectively corresponding to the N bits of the count value. In addition, the count enabling signals are enabled when levels of the corresponding bits change. The value counting unit receives the count enabling signals to determine and provide the next count value of the counter. The reset counter unit receives a reset counter value and the current count value and compares the reset counter value and the current count value to output a reset counter signal to the state determination unit to reset the count value.

Based on the above, the counter according to the embodiments of the invention divides the bits of the count value into two parts. The low bit part is processed by using fewer logic gates (e.g. having only two gate delays), while the high bit part is processed by using more logic gates (e.g. having at most three gate delays). Accordingly, the overall gate delay of the counter may be reduced. In this way, the counter may have a fixed and reduced gate delay and is influenced less by the gate delay when processing at a high speed.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
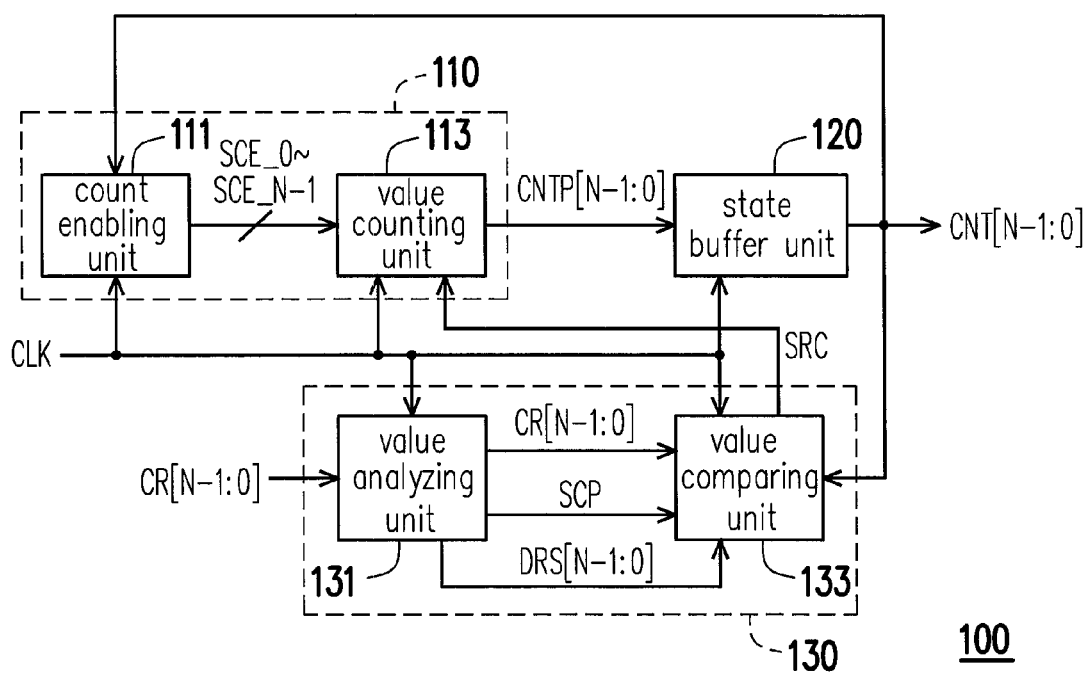
FIG. 1 is a schematic diagram illustrating a system of a counter according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic diagram illustrating a system of a counter according to an embodiment of the invention. Referring to FIG. 1, in this embodiment, a counter 100 includes a state determination unit 110, a state buffer unit 120, and a reset counter unit 130. The state determination unit 110 receives a current count value CNT[N−1:0] having N bits to calculate a next count value CNTP[N−1:0] of the counter 100, and receives a clock signal CLK to output the count value CNTP[N−1:0] based on the clock signal CLK. In addition, N is a positive integer, and the count value CNT[N−1:0] has a high bit count part (e.g. CNT[N−1:P], wherein P is a positive integer smaller than N) and a low bit count part (e.g. CNT[P−1:0]).

The state buffer unit 120 receives the clock signal CLK and the count value CNTP[N−1:0] to set the count value CNTP [N−1:0] output based on the clock signal CLK as the current count value CNT[N−1:0]. The reset counter unit 130 receives a rest count value CR[N−1:0] and the count value CNT[N−1:0] and compares the reset counter value CR[N−1:0] and the count value CNT[N−1:0], so as to output a reset counter signal SRC to the state determination unit 110 to reset the count value CNTP [N−1:0] when the reset counter value CR[N−1:0] is equal to the count value CNT[N−1:0]. In addition, the reset counter unit 130 receives the clock signal CLK to output the reset counter signal SRC based on the clock signal CLK.

In addition, in this embodiment, the state determination unit 110 includes a count enabling unit 111, and a value counting unit 113. The count enabling unit 111 receives the count value CNT[N−1:0] and the clock signal CLK to output count enabling signals SCE_0 to SCE_N−1 respectively corresponding to each bit in the count value CNT[N−1:0]. Moreover, the count enabling signals SCE_0 to SCE_N−1 are enabled when levels of the corresponding bits are changed. In other words, when CNT[M−1] is about to be changed from a high logic level "H" to a low logic level "L", SCE_M is enabled for an operation cycle, wherein SCE_0 is permanently enabled. The value counting unit 113 receives the count enabling signals SCE_0 to SCE_N−1, and respectively determines logic levels (e.g. the low logic level "L") of the bits of the count value CNTP[N−1:0] based on the count enabling signals SCE_0 to SCE_N−1, and provides the count value CNTP[N−1:0] to the state buffer unit 120.

The reset counter unit 130 includes a value analyzing unit 131 and a count comparing unit 133. The value analyzing unit 131 receives and outputs the reset counter value CR[N−1:0] having N bits, receives the clock signal CLK, compares the reset counter value CR[N−1:0] and a delay cycle value M to output a value comparing signal SCP, and outputs a reset error value DRS[N−1:0] based on the reset counter value CR[N−1:0] and the delay cycle value M. In addition, the delay cycle value M is a ceiling of $\log_2(2 \times N)$ (i.e. ceiling($\log_2(2 \times N)$)), and the reset error value DRS[N−1:0] is a difference between the reset counter value CR[N−1:0] and the delay cycle value M.

The count comparing unit 133 receives the clock signal CLK and determines to use a first comparator or a second comparator based on the value comparing signal SCP. In addition, a bit number of the first comparator is smaller than a bit number of the second comparator. Then, based on a comparison result of the comparator and the clock signal CLK, the count comparing unit 133 outputs the reset counter signal SRC to the state determination unit 110 to reset the count value CNTP[N−1:0]. For example, when the reset counter value CR[N−1:0] is greater than or equal to the delay cycle value M, the count comparing unit 133 uses the second comparator for comparison, and the SCP at this time is 1. However, the invention is not limited thereto. When the reset counter value CR[N−1:0] is smaller than the delay cycle value M, the count comparing unit 133 uses the first comparator, and the SCP at this time is 0. However, the invention is not limited thereto. In addition, the first comparator is configured to compare at least one low bit in the count value CNT[N−1:0] and a corresponding part in the reset counter value CR[N−1:0], and the second comparator is configured to compare the reset error value DRS[N−1:0] and the count value CNT[N−1:0]. Moreover, a value that the low bit in the count value CNT[N−1:0] may represent is smaller than the delay cycle value M.

Based on the above, when the count comparing unit 133 uses the second comparator for comparison, since a delay (i.e. the delay cycle value M) caused by operation is considered, an influence due to a gate delay may be eliminated. Moreover, when the count comparing unit 133 uses the first comparator for comparison, since the gate delay of the comparator having fewer bits is lower, an influence so rendered may be reduced.

Moreover, since the count comparing unit 133 operates based on the clock signal CLK, the state buffer unit 120 may be omitted without influencing an overall operation of the counter 100 in some embodiments.

Figure 2:
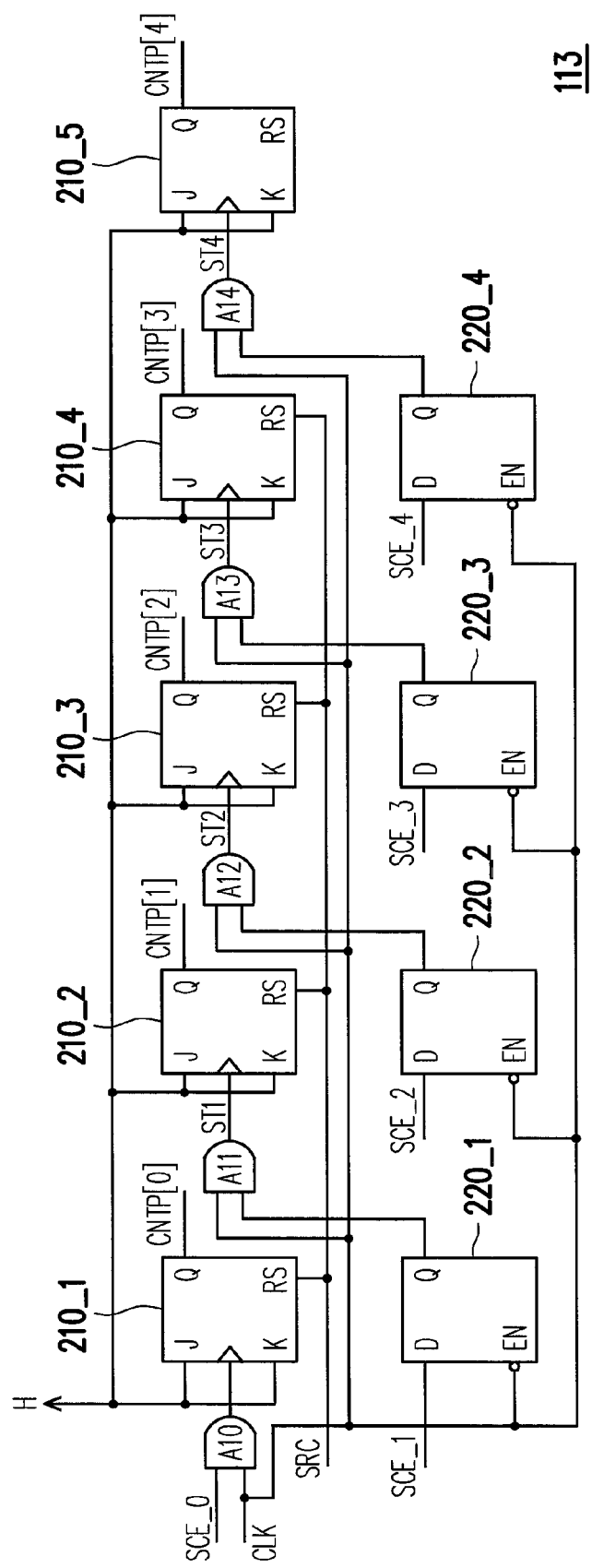
FIG. 2 is a schematic diagram illustrating a circuit of a value counting unit according to an embodiment of the invention.

FIG. 2 is a schematic diagram illustrating a circuit of a value counting unit according to an embodiment of the invention. Referring to FIGS. 1 and 2, N is set to be 5 herein for the ease of illustration. However, the embodiments of the invention are not limited thereto. Meanwhile, like or similar elements are referred to by like or similar reference symbols below. In this embodiment, the value counting unit 113 includes five logic elements 210_1 to 210_5 (JK flip-flops, for example), four latches 220_1 to 220_4 (D flip-flops, for example), and five AND gates A10 to A14. Output ends Q of the JK flip-flops 210_1 to 210_5 respectively output the count value CNTP[4:0], and input ends J and K of the JK flip-flops 210_1 to 210_5 jointly receive the high logic level "H". At this time, the JK flip-flops 210_1~210_5 operate like a T flip-flop. Moreover, reset ends RS of the JK flip-flops 210_1 to 210_5 receive the reset counter signal SRC.

A trigger end of the first JK flip-flop 210_1 is coupled to an output end of the AND gate A10, and input ends of the AND gate A10 respectively receive the clock signal CLK and the count enabling signal SCE_0. In addition, a value of the count enabling signal SCE_0 may be 1'b1. Namely, the SCE_0 may be permanently enabled. In other words, the trigger end of the first JK flip-flop 210_1 is equivalent to receiving the clock signal CLK, so as to change a logic level of a bit CNTP[0] based on the clock signal CLK. Trigger ends of the second to fifth JK flip-flops 210_2 to 210_5 respectively receive level setting signals ST1 to ST4 to respectively change logic levels of bits CNTP[1:4] based on the corresponding level setting signals ST1 to ST4. Input ends D of the flip-flops 220_1 to 220_4 respectively receive the count enabling signals SCE_1 to SCE_4, and enabling ends EN of the flip-flops 220_1 to 220_4 receive the clock signal CLK. At this time, the flip-flops 220_1 to 220_4 respectively output the corresponding count enabling signals SCE_1 to SCE_4 at output ends Q thereof based on the clock signal CLK. Input ends of the AND gates A11 to A14 respectively receive the clock signal CLK and the count enabling signals SCE_1 to SCE_4 output by the corresponding D flip-flops 220_1 to 220_4, so as to output corresponding level setting signals ST1 to ST4 to the corresponding JK flip-flops 210_2 to 210_5.

Based on the above, the JK flip-flops 210_2 to 210_5 are triggered when levels of the corresponding level setting signals ST1 to ST4 change, and remain the same otherwise. In addition, the D flip-flops 220_1 to 220_4 are alternately turned on and turned off based on the clock signal CLK. Thus, an overall power consumption of the counter 100 may be reduced.

Figure 3A:
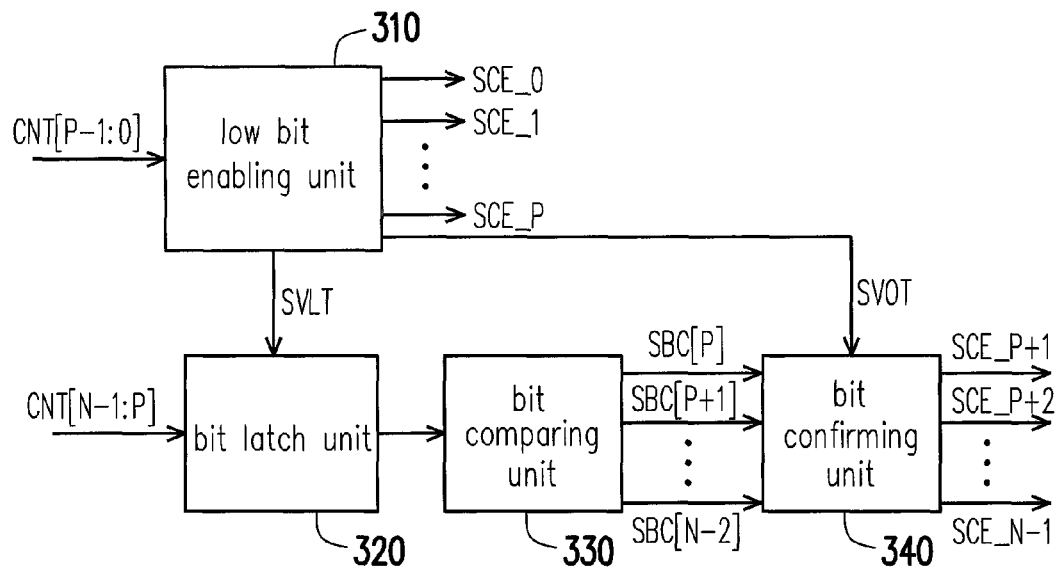
FIGS. 3A and 3B are schematic diagrams illustrating a system of a count enabling unit according to an embodiment of the invention.

FIG. 3A is a schematic diagram illustrating a system of a count enabling unit according to an embodiment of the invention. In this embodiment, the count enabling unit 111 includes a low bit enabling unit 310, a bit latch unit 320, a bit comparing unit 330, and a bit confirming unit 340. The low bit enabling unit 310 receives the low bit count part CNT[P−1:0] and outputs the count enabling signals SCE_0 to SCE_P (corresponding to first count enabling signals) respectively corresponding to the low bit count part CNT[P−1:0], a value latch signal SVLT, and a value output signal SVOT. The count enabling signals SCE_0 to SCE_P are determined based on an equation as follows:

$$SCE\_n = \prod_{i=0}^{n-1} CNT(i:0) \qquad (1)$$

In addition, n is a positive integer. Namely, the count enabling signals SCE_0 to SCE_P are respectively enabled when bits of the low bit count part CNT[P−1:0] with addresses lower than an address of the corresponding $n_{th}$ bit are all at the high logic level "H". The value latch signal SVLT is enabled when the low bit count part CNT[P−1:0] is all at the low logic level "L". The value output signal SVOT is enabled when the low bit count part CNT[P−1:0] is all at the high logic level "H".

The bit latch unit 320 receives the high bit count part CNT[N−1:P] and the value latch signal SVLT to output the high bit count part CNT[N−1:P] based on the value latch signal SVLT. Namely, when the value latch signal SVLT is enabled, the high bit count part CNT[N−1:P] is output to the bit comparing unit 330. The bit comparing unit 330 receives the high bit count part CNT[N−1:P] output by the bit latch unit 320 to output bit comparing signals SBC[P], SBC[P+1], SBC[P+2] ... SBC[N−2]. In addition, the bit comparing unit 330 is configured to verify whether the high bit count parts CNT[P], CNT[P+1:P], CNT[P+2:P] ... CNT[N−2:P] are all "1". When CNT[P] is "1", the outputted bit comparing signal SBC[P] is enabled, and when CNT[P+1:P] is "1", the bit comparing signal SBC[P+1] is enabled, and so on so forth. In other words, the bit comparing signals SBC[P], SBC[P+1], SBC[P+2] ... SBC[N−2] are enabled when bits of the high bit count part (count value CNT[N−1:P]) with addresses lower than and equal to the address of the corresponding bit are all at the high logic level "H". For example, SBC[N−2] is enabled when the count value CNT[N−2:P] is all at the high logic level "H".

The bit confirming unit 340 receives the bit comparing signals SBC[P], SBC[P+1], SBC[P+2] ... SBC[N−2] and the value output signal SVOT to output the count enabling signals SCE_P+1 to SCE_N−1 (corresponding to second count enabling signals) based on the value output signal SVOT and the bit comparing signals SBC[P], SBC[P+1], SBC[P+2] ... SBC[N−2]. In addition, the count enabling signals SCE_P+1 to SCE_N−1 are respectively enabled when the bits of the count value with the addresses lower than the address of the corresponding bit are all at the high logic level. In other words, when the value output signal SVOT is enabled, and the bit comparing signal SBC[P] is also "1", the count enabling signal SCE_P+1 is enabled. When the value output signal SVOT is enabled, and the bit comparing signal SBC[P+1] is also "1", the count enabling signal SCE_P+2 is enabled, and so on so forth.

Figure 3B:
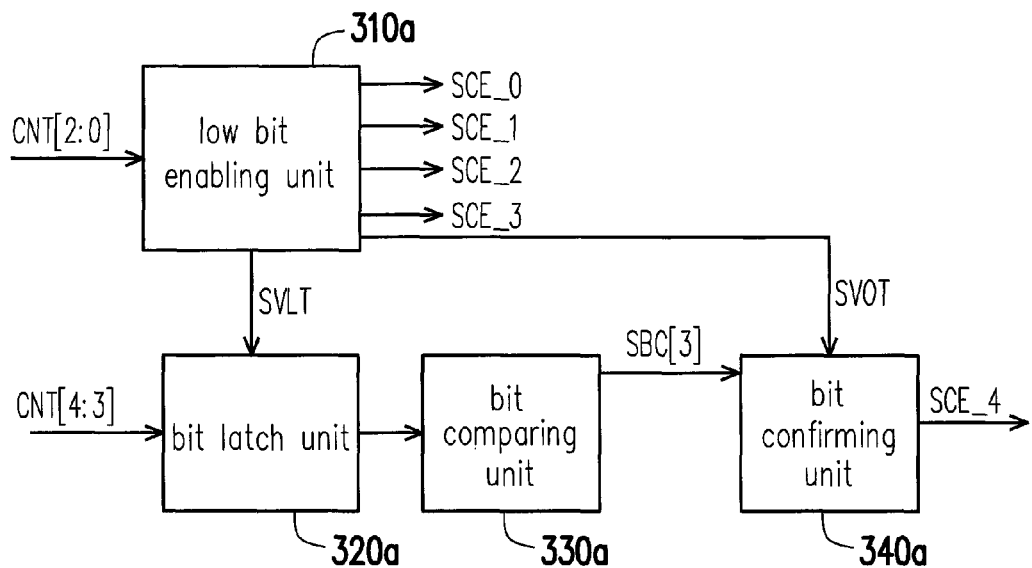

Referring to FIG. 1 and FIGS. 3A and 3B, N is set to be 5 and P is set to be 3 herein for the ease of illustration. However, the embodiments of the invention are not limited thereto. Meanwhile, like or similar elements are referred to by like or similar reference symbols below. In this embodiment, a count enabling unit 111a includes a low bit enabling unit 310a, a bit latch unit 320a, a bit comparing unit 330a, and a bit confirming unit 340a.

The low bit enabling unit 310a receives the count value CNT[2:0] (corresponding to the low bit count part), and outputs the count enabling signals SCE_0 to SCE_3 (corresponding to the first count enabling signal) respectively corresponding to the count value CNT[2:0], the value latch signal SVLT, and the value output signal SVOT. The count enabling signals SCE_0 to SCE_3 are determined based on the following equation:

$$SCE\_n = \prod_{i=0}^{n-1} CNT(i=0) \qquad (1)$$

In addition, n is a positive integer. Namely, the count enabling signals SCE_0 to SCE_3 are respectively enabled when the bits of the low bit count part (e.g. CNT[2:0]) with the addresses lower than the address of the corresponding $n_{th}$ bit are all at the high logic level "H". For example, the count enabling signal SCE_2 is enabled when the count value CNT [1:0]=2'b11, and so on so forth. The value latch signal SVLT is enabled when the count value CNT[2:0] is all at the low logic level "L". For example, the value latch signal SVLT is enabled when the count value CNT[2:0]=3'b000. The value output signal SVOT is enabled when the count value CNT[2:0] is all at the high logic level "H". For example, the value output level SVOT is enabled when the count value CNT[2:0]=3'b111.

The bit latch unit 320a receives the count value CNT[4:3] (corresponding to the high bit count part) and the value latch signal SVLT to output the count value CNT [4:3] based on the value latch signal SVLT. Namely, when the value latch signal SVLT is enabled, the count value CNT[4:3] is output to the bit comparing unit 330a. The bit comparing unit 330a receives the count value CNT[4:3] output by the bit latch unit 320a to output the bit comparing signal SBC[3]. The bit comparing unit 330a is configured to verify whether CNT[3] is "1". When CNT[3] is "1", the bit comparing signal SBC[3] that is output is enabled. In other words, the bit comparing signal (e.g. SBC[3]) is enabled when the bits of the high bit count part (e.g. count value CNT[4:3]) with the addresses lower than and equal to the address of the corresponding bit (e.g. count value CNT[3]) are at the high logic level "H". For example, the SBC_3 is enabled when the count value CNT[3] is at the high logic level "H".

The bit confirming unit 340a receives the bit comparing signal SBC[3] and the value output signal SVOT to output the count enabling signal SCE_4 (corresponding to the second count enabling signal) based on the value output signal SVOT and the bit comparing signal SBC[3]. In addition, the count enabling signal SCE_4 is enabled when the bits of the count value with the addresses lower than the address of the corresponding bit (i.e. the fourth bit) are all at the high logic level. In other words, when the value output signal SVOT is enabled, and the bit comparing signal SBC[3] is "1", the count enabling signal SCE_4 is enabled.

Based on the above, the low bit enabling unit 310a may be designed to have a high response speed (e.g. completing an operation during an operation cycle). In this way, the count value CNT[2:0] may respond immediately to change the logic level. Moreover, the count value CNT[4:3] at least has eight (i.e. 2^3) operation cycles to complete the operation. Therefore, the bit comparing unit 330a and the bit confirming unit 340a may use logic gates of more stages to complete the operation without influencing the high speed operation of the counter 100.

Figure 4:
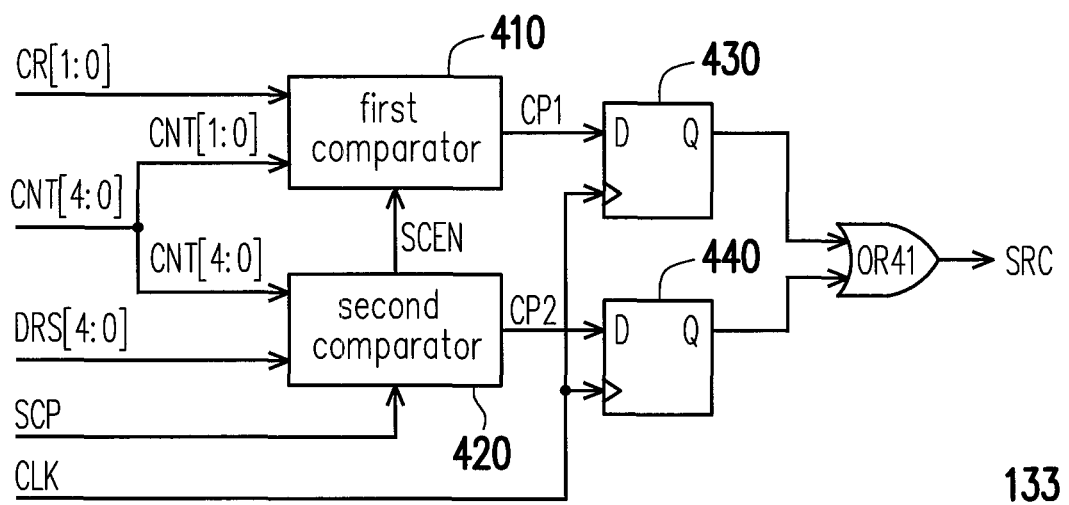
FIG. 4 is a schematic diagram illustrating a circuit of a count comparing unit according to an embodiment of the invention.

FIG. 4 is a schematic diagram illustrating a circuit of a count comparing unit according to an embodiment of the invention. Referring to FIGS. 1 and 4, N is set to be 5 herein for the ease of illustration. Namely, the delay cycle value M is equal to 4 (i.e. ceiling($\log_2(2\times 5)$)). However, the embodiments of the invention are not limited thereto. Meanwhile, like or similar elements are referred to by like or similar reference symbols below. The count comparing unit 133 includes a first comparator 410, a second comparator 420, latches 430 and 440 (D flip-flops, for example), and an OR gate 41. In addition, the first comparator 410 is set to be a two-bit comparator (i.e. capable of representing a value of 3).

The first comparator 410 receives a comparing enabling signal SCEN, and receives the count value CNT[1:0] and the reset counter value CR[1:0] to provide a first comparing signal CP1. The input end D of the latch 430 (corresponding to a first latch) receives the first comparing signal CP1, a trigger end of the latch 430 receives the clock signal CLK, and the latch 430 outputs the first comparing signal CP1 at the output end Q thereof based on the clock signal CLK.

The second comparator 420 receives the value comparing signal SCP, the count value CNT[4:0], and the reset error value DRS[4:0] to provide a second comparing signal CP2 based on the count value CNT[4:0] and the reset error value DRS[4:0] and provide the comparing enabling signal SCEN based on the value comparing signal SCP. In other words, when the value comparing signal SCP indicates that the reset counter value CR[4:0] is greater than or equal to the delay cycle value M (e.g. enabled), the comparing enabling signal SCEN is disabled. When the value comparing signal SCP indicates that the reset counter value CR[4:0] is smaller than the delay cycle value M (e.g. disabled), the comparing enabling signal SCEN is enabled. The input end D of the latch 440 (corresponding to a second latch) receives the second comparing signal CP2, a trigger end of the latch 440 receives the clock signal CLK, and the latch 440 outputs the second comparing signal CP2 at the output end Q thereof based on the clock signal CLK.

Input ends of the OR gate 41 receive the first comparing signal CP1 output by the latch 430 and the second comparing signal CP2 output by the latch 440 to output the reset counter signal SRC.

Figure 5:
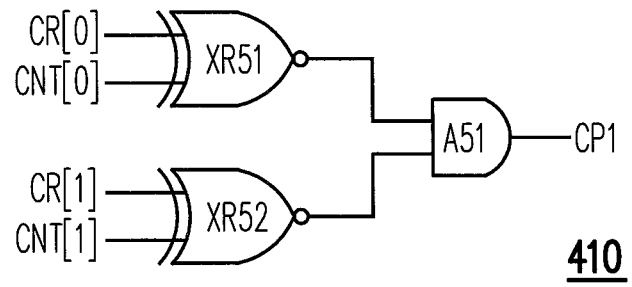
FIG. 5 is a schematic diagram illustrating a circuit of a first comparator according to an embodiment of the invention.

FIG. 5 is a schematic diagram illustrating a circuit of a first comparator according to an embodiment of the invention. Referring to FIGS. 4 and 5, like or similar elements are referred to by like or similar reference symbols. In this embodiment, the first comparator 410 is also set to be a two-bit comparator. In addition, the first comparator 410 includes XNOR gates XR51 to XR52 and an AND gate A51. Moreover, the XNOR gates XR51 to XR52 and the AND gate A51 may operate based on the comparing enabling signal SCEN. The XNOR gate XR51 receives the reset counter value CR[0] and the count value CNT[0], and the XNOR gate XR52 receives the reset counter value CR[1] and the count value CNT[1]. Input ends of the AND gate A51 are coupled to output ends of the XNOR gates XR51 to XR52, and an output end of the AND gate A51 provides the first comparing signal CP1. Namely, the AND gate A51 performs an AND gate operation for outputs of the XNOR gates XR51 and XR52 and then outputs the first comparing signal CP1.

Figure 6:
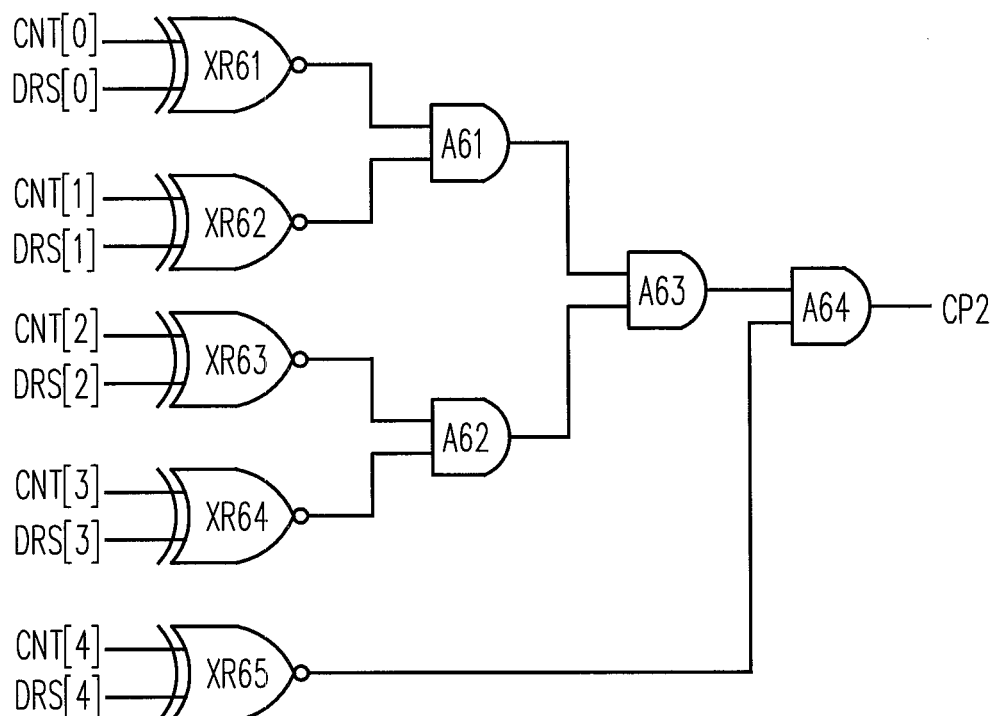
FIG. 6 is a schematic diagram illustrating a circuit of a second comparator according to an embodiment of the invention.

FIG. 6 is a schematic diagram illustrating a circuit of a N bit comparator according to an embodiment of the invention. Referring to FIGS. 4 and 6, like or similar elements are referred to by like or similar reference symbols. In this embodiment, the second comparator 420 is set to be a five-bit comparator, and includes XNOR gates XR61 to XR65 and AND gates A61 to A64. In addition, the XNOR gates XR61 to XR65 and the AND gates A61 to A64 may operate based on the value comparing signal SCP. The XNOR gate XR61 receives the reset error value DRS [0] and the count value CNT[0], the XNOR gate XR62 receives the reset error value DRS[1] and the count value CNT[1], the XNOR gate XR63 receives the reset error value DRS [2] and the count value CNT[2], the XNOR gate XR64 receives the reset error value DSR[3] and the count value CNT[3], and the XNOR gate XR65 receives the reset error value DRS[4] and the count value CNT[4].

Input ends of the AND gate 61 are coupled to output ends of the XNOR gates XR61 and XR62, input ends of the AND gate 62 are coupled to output ends of the XNOR gates XR63 and XR64, input ends of the AND gate A63 are coupled to output ends of the AND gates A61 and A62, and input ends of the AND gate A64 are coupled to an output end of the AND gate A63 and an output end of the XNOR gate XR65. An output end of the AND gate A64 provides the second comparing signal CP2. Namely, the AND gates A61 to A64 perform an AND gate operation for outputs of the XNOR gates XR61 to XR65 and then output the second comparing signal CP2.

In addition, it should be noted that FIGS. 1 to 4 are drawn for an illustrative purpose. Although some elements are drawn to operate based on the clock signal CLK, in some other embodiments of the invention, all elements may operate based on the clock signal CLK. People having ordinary skills in the art may set accordingly based on practical needs, and the invention is not limited thereto.

In view of the foregoing, the counter according to the embodiments of the invention divides the bits of the count value into two parts. The low bit part is processed by using fewer logic gates (e.g. having only two gate delays), while the high bit part is processed by using more logic gates (e.g. having at most three gate delays). Accordingly, the overall gate delay of the counter may be reduced. In this way, the counter may have a fixed and reduced gate delay and is influenced less by the gate delay when processing at a high speed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A counter, configured to output a count value having N bits, wherein N is a positive integer, the counter comprising:
   a state determination unit, receiving a current count value to calculate a next count value of the counter, wherein the next count value has a high bit count part and a low bit count part;
   a value analyzing unit, receiving and outputting a reset counter value, comparing the reset counter value and a delay cycle value to output a value comparing signal; and
   a count comparing unit, receiving a clock signal, determining to use a first comparator or a second comparator based on the value comparing signal, and outputting a reset counter signal to the state determination unit to reset the next count value based on a comparison result and the clock signal, wherein a bit number of the first comparator is smaller than a bit number of the second comparator.

2. The counter as claimed in claim 1, further comprising:
   a state buffer unit, receiving the clock signal and the next count value to set the next count value output based on the clock signal to be the current count value.

3. The counter as claimed in claim 1, wherein the delay cycle value is equivalent to a ceiling of $\log_2(2 \times N)$.

4. The counter as claimed in claim 1, wherein the value analyzing unit outputs a reset error value based on the reset counter value and the delay cycle value, and the reset error value is a difference between the reset counter value and the delay cycle value.

5. The counter as claimed in claim 4, wherein the count comparing unit comprises:
the first comparator, receiving a comparing enabling signal, and receiving at least one low bit of the low bit count part of the current count value and a corresponding bit part in the reset counter value to provide a first comparing signal;
the second comparator, receiving the value comparing signal, the current count value, and the reset error value to provide a second comparison signal based on the count value and the reset error value, and providing the comparing enabling signal based on the value comparing signal; and
an OR gate, receiving the first comparing signal and the second comparison signal to output the reset counter signal.

6. The counter as claimed in claim 5, wherein the first comparator comprises:
a plurality of XNOR gates for comparing the at least one low bit of the count value and the corresponding part of the reset counter value; and
a plurality of AND gates for outputting the first comparing signal after performing an AND gate operation for outputs of the XNOR gates,
wherein the XNOR gates and the AND gates operate based on the comparing enabling signal.

7. The counter as claimed in claim 5, wherein the second comparator comprises:
a plurality of XNOR gates for comparing the reset error value and the current count value; and
a plurality of AND gates for outputting the second comparison signal after performing an AND gate operation for outputs of the XNOR gates,
wherein the XNOR gates and the AND gates operate based on the value comparing signal.

8. The counter as claimed in claim 1, wherein the state determination unit comprises:
a count enabling unit, receiving the current count value to output a plurality of count enabling signals respectively corresponding to the N bits of the current count value, wherein the count enabling signals are enabled when levels of the corresponding bits of the current count value change; and
a value counting unit, receiving the count enabling signals to determine and provide the next count value of the counter.

9. The counter as claimed in claim 8, wherein the value counting unit comprises:
N logic elements for respectively outputting one of the N bits, wherein the first logic element changes a logic level of the lowest bit of the N bits based on the clock signal, and each of the second to the $N_{th}$ logic elements receives a level setting signal, making logic levels of other corresponding bits of the N bits changed based on the corresponding level setting signals;
N−1 latches, wherein each of the latches receives the clock signal and one of the count enabling signals to output the corresponding count enabling signal based on the clock signal; and
N−1 AND gates, wherein each of the AND gates receives the clock signal and the count enabling signal output by the corresponding latch, making the corresponding level setting signals respectively output to the second to $N_{th}$ logic elements.

10. The counter as claimed in claim 8, wherein the count enabling unit comprises:
a low bit enabling unit, receiving the low bit count part to output a plurality of first count enabling signals respectively corresponding to the low bit count part, a value latch signal, and a value output signal, wherein the first count enabling signals are respectively enabled when the bits of the low bit count part with addresses lower than the corresponding bit are all at a high logic level, the value latch signal is enabled when the bits of the low bit count part are all at a low logic level, and the value output signal is enabled when the current low bit count part is all at the high logic level;
a bit latch unit, receiving the high bit count part and the value latch signal to output the high bit count part based on the value latch signal;
a bit comparing unit, receiving the high bit count part output by the bit latch unit to output a plurality of bit comparing signals respectively corresponding to the high bit count part, wherein the bit comparing signals are respectively enabled when the bits of the high bit count part with addresses lower than and equal to the address of the corresponding bit are all at the high logic level; and
a bit confirming unit, receiving the bit comparing signals and the value output signal to output at least one second count enabling signal of the count enabling signals based on the value output signal and the bit comparing signals, wherein the second enabling signals are respectively enabled when the bits of the count value with addresses lower than the address of the corresponding bit are all at the high logic level.

11. A counter, configured to output a count value having N bits, wherein N is a positive integer, the counter comprising:
a state determination unit, receiving a current count value to calculate a next count value of the counter, wherein the count value has a high bit count part and a low bit count part, the state determination unit comprising:
a count enabling unit, receiving the current count value to output a plurality of count enabling signals respectively corresponding to the N bits of the count value, wherein the count enabling signals are enabled when levels of the corresponding bits change; and
a value counting unit, receiving the count enabling signals to determine and provide the next count value of the counter; and
a reset counter unit, receiving a reset counter value and the current count value and comparing the reset counter value and the current count value to output a reset counter signal to the state determination unit to reset the count value.

12. The counter as claimed in claim 11, further comprising:
a state buffer unit, receiving a clock signal and the next count value to set the next count value output based on the clock signal to be the current count value.

13. The counter as claimed in claim 11, wherein the value counting unit comprises:
N logic elements for respectively outputting one of the N bits, wherein the first logic element changes a logic level of the lowest bit of the N bits based on the clock signal, and each of the second to the $N_{th}$ logic elements receives a level setting signal, making logic levels of other corresponding bits of the N bits changed based on the corresponding level setting signals;

N-1 latches, wherein each of the latches receives the clock signal and one of the count enabling signals to output the corresponding count enabling signal based on the clock signal; and N-1 AND gates, wherein each of the AND gates receives the clock signal and the count enabling signal output by the corresponding latch, making the corresponding level setting signals respectively output to the second to $N_{th}$ logic elements.

14. The counter as claimed in claim 11, wherein the count enabling unit comprises:

a low bit enabling unit, receiving the low bit count part to output a plurality of first count enabling signals respectively corresponding to the low bit count part, a value latch signal, and a value output signal, wherein the first count enabling signals are respectively enabled when the bits of the low bit count part with addresses lower than an address of a corresponding bit are all at a high logic level, the value latch signal is enabled when the bits of the low bit count part are all at a low logic level, and the value output signal is enabled when the current low bit count part is all at the high logic level;

a bit latch unit, receiving the high bit count part and the value latch signal to output the high bit count part based on the value latch signal;

a bit comparing unit, receiving the high bit count part output by the bit latch unit to output a plurality of bit comparing signals respectively corresponding to the high bit count part, wherein the bit comparing signals are respectively enabled when the bits of the high bit count part with addresses lower than and equal to the address of the corresponding bit are all at the high logic level; and a bit confirming unit, receiving the bit comparing signals and the value output signal to output at least one second count enabling signal of the count enabling signals based on the value output signal and the bit comparing signals, wherein the second enabling signals are respectively enabled when the bits of the count value with addresses lower than the address of the corresponding bit are all at the high logic level.

* * * * *